(12) United States Patent
Cases et al.

(10) Patent No.: US 8,201,133 B2
(45) Date of Patent: Jun. 12, 2012

(54) PRINTED CIRCUIT BOARD WITH REDUCED SIGNAL DISTORTION

(75) Inventors: Moises Cases, Austin, TX (US); Tae H. Kim, Austin, TX (US); Bhyrav M. Mutnury, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 992 days.

(21) Appl. No.: 12/140,730

(22) Filed: Jun. 17, 2008

(65) Prior Publication Data

US 2009/0308649 A1    Dec. 17, 2009

(51) Int. Cl.
*G06F 17/50* (2006.01)
(52) U.S. Cl. ......... 716/137; 716/110; 716/115; 716/126
(58) Field of Classification Search .......... 716/108–119, 716/124–126, 137
See application file for complete search history.

(56) References Cited

U.S. PATENT DOCUMENTS

| | | | |
|---|---|---|---|
| 6,230,401 B1 | 5/2001 | Ligander et al. | |
| 6,370,030 B1 | 4/2002 | Bergstedt et al. | |
| 7,043,706 B2 | 5/2006 | Brist et al. | |
| 7,361,842 B2 | 4/2008 | Brist et al. | |
| 7,388,448 B2 | 6/2008 | Tabatabai | |
| 7,400,214 B2 | 7/2008 | Storniolo et al. | |
| 7,561,006 B2 | 7/2009 | Dutta | |
| 2004/0181764 A1* | 9/2004 | Brist et al. | 716/6 |
| 2006/0108145 A1 | 5/2006 | Ueno | |
| 2006/0207087 A1 | 9/2006 | Jafri et al. | |
| 2008/0315977 A1 | 12/2008 | Green et al. | |
| 2010/0138802 A1* | 6/2010 | Kobayashi | 716/10 |

OTHER PUBLICATIONS

Chien, etal., The Signal Transmission Characteristics of Embedded Microstrip Transmission Lines Over a Meshed Ground Plane in Copper/Polyimide Multichip Module, IEEE Transactions on Components , packaging, and Manufacturing Technology, Nov. 1994, 578-583, vol. 17 No. 4, IEEE.
D.J. Frank, Shorter Wires for VLSI, BBH, Jul. 1992, No. 339, Kenneth Mason Publications Ltd., England.
Dissertation, "Compliant Wafer Level Package (CWLP) with Embedded Air-Gaps for Sea of Leads (SoL) Interconnections", by Hollie Reed et al., Issue Date: May 2001 Publisher: Georgia Institute of Technology, pp. 151-153.

* cited by examiner

*Primary Examiner* — Paul Dinh
(74) *Attorney, Agent, or Firm* — Edward J. Lenart; Cynthia G. Seal; Biggers & Ohanian, LLP.

(57) ABSTRACT

A printed circuit board with reduced signal distortion, including one or more layers of non-conductive substrate upon which are disposed conductive pathways that conduct signals, the signals characterized by distortion at least partly caused by orientation of the conductive pathways on the layers of the printed circuit board, and a periodically patterned reference plane; each conductive pathway that conducts signals oriented orthogonally or diagonally at forty-five degrees with respect to other conductive pathways that conduct signals on the printed circuit board; the periodically patterned reference plane comprising a conductor having discontinuities arranged in a periodically recurring pattern, the pattern of the discontinuities oriented on a surface of a layer of the printed circuit board at an optimum angle, with respect to the conductive pathways that conduct signals on the printed circuit board, that reduces distortion of the signals.

12 Claims, 5 Drawing Sheets

PRINTED CIRCUIT BOARD WITH REDUCED SIGNAL DISTORTION

BACKGROUND OF THE INVENTION

1. Field of the Invention

The field of the invention is data processing, or, more specifically, a printed circuit board ('PCB') with reduced signal distortion, methods for signal transmission on a PCB with reduced signal distortion, and methods of designing a PCB with reduced signal distortion.

2. Description of Related Art

Common electronic equipment, such as personal computers, cellular phones, servers, and the like, often includes a number of printed circuit boards. A printed circuit board ('PCB') may be used to mechanically support and electrically connect electronic components using conductive pathways, or traces, etched from copper sheets laminated onto a non-conductive substrate. PCBs may include one or more layers of non-conductive substrate upon which are disposed conductive pathways and a reference plane. Such conductive pathways, referred to as 'traces,' may supply power to electrical circuits on the PCB or conduct signals on the printed circuit board between electrical components. A trace that conducts a signal is referred to in this specification as a 'signal trace.'

A reference plane, also referred to as a ground plane, is a layer of conductive material, typically copper, used as an infinite ground potential on a PCB. Reference planes may include periodically recurring patterns of discontinuities. Such periodically patterned reference planes are used generally for isolating simultaneous switching noise ('SSN') commonly referred to as 'ground bounce,' reducing radiated electromagnetic interference ('EMI'), protecting circuitry from electrostatic discharge ('ESD'), and separating circuits of different voltage levels.

Periodically patterned reference planes of PCBs in the prior art are not oriented at an angle that reduces distortion of signals conducted on signal traces of the PCBs. In fact, periodically patterned reference planes implemented on PCBs of the prior art, typically increase signal distortion of high frequency electrical signals conducted along signal traces. Such increase of signal distortion is due, in part, to longer than necessary current return paths of high speed signals conducted on the signal traces. In addition to increasing signal distortion on PCBs, periodically pattern reference planes implemented on PCBs of the prior art also cause variations of impedance characteristics among all signal traces on a PCB, increasing difficulty of design of the PCB and electrical circuits on the PCB.

Some PCBs of the prior art are specifically configured to minimize signal distortion caused by a periodically patterned reference plan, but these configurations are time-consuming with respect to design of the PCB, extremely costly to implement, and generally ineffective. On some PCBs of the prior art, for example, signal traces are routed around discontinuities of the periodically patterned reference plane such that signal distortion caused by the orientation of the periodically patterned reference plane is reduced. Such routes of the signal traces are typically much longer than necessary, increasing cost of the PCB. Other PCBs of the prior art include an extra or very thick non-conductive substrate between the signal traces and the periodically patterned ground plane, greatly increasing the size and cost of the PCB.

Consider as one example of a PCB of the prior art, the PCB depicted in FIG. 1. FIG. 1 illustrates a printed circuit board (102) of the prior art having signal traces on the PCB (102) that are routed around discontinuities (104) of a periodically patterned reference plane (106). The PCB of FIG. 1 includes a periodically patterned reference plane (106) disposed on a surface of a layer of the PCB. The periodically patterned reference plane (116) is a conductor having discontinuities (104) arranged in a periodically recurring pattern. A segment of the pattern (116) is depicted in the example of FIG. 1 within dotted lines for ease of explanation. In this example the pattern is a grid-like pattern although readers of skill in the art will recognize that periodically patterned reference planes may include any type of periodically recurring pattern of discontinuities.

Mounted on a layer of the PCB of FIG. 1 different from the layer on which the periodically patterned plane is disposed is an integrated circuit capable of transmitting high frequency signals along any of the three signal traces (110, 112, and 114) on the PCB of FIG. 1. Each of the signal lines is routed, on a layer of the PCB different than that on which the periodically patterned plane is disposed. Each of the signal lines is also routed such that the routes cross relatively few discontinuities (104) of the periodically patterned reference plane. The route of signal trace (110) crosses discontinuities (104) of the periodically patterned reference plane only twice. The routes of signal trace (112) and signal trace (114) do not cross discontinuities (104) of the periodically patterned reference at all. Routing the signal traces (110, 112, and 114) around the discontinuities typically increases the length of such signal traces and increases design complexity as can be seen in FIG. 1.

Consider as another example of a PCB of the prior art, the PCB depicted in FIG. 2. FIG. 2 illustrates a printed circuit board (102) of the prior art in which current return paths for signals are longer than necessary. In the example of FIG. 2, the signal traces (110, 112, and 114) are not routed around discontinuities in the periodically patterned ground plane. A current return path of a high frequencies signal, such as a signal having a frequency greater than 1 gigahertz, follows a path of least inductance, a path on the reference plane that follows the signal trace on which the high frequency signal is conducted. Longer current return paths typically induce noise into a signal and distort the signal. As can be seen from the example of FIG. 2, when signal traces are not routed around discontinuities in the periodically patterned reference plane (106), the current return paths (202, 206, 204), represented in FIG. 2 by dashed lines, do not precisely follow their associated signal traces but must route around the discontinuities of the periodically patterned reference plane (106). When current return paths are routed around discontinuities, the current return path is longer than necessary, or longer than an ideal current return path. An 'ideal' current return path is a current return path the precisely follows its associated signal trace.

In addition to longer than ideal current return paths, the periodically patterned reference plane in the example of FIG. 2 also introduces another problem. The signal traces (110, 112, and 114) in the example of FIG. 2, even if the same length, have different impedance characteristics due to the number of discontinuities of the reference plane per unit length crossed by the signals. That is, signal traces of the same length on the PCB (102) of FIG. 2, if oriented differently, have different impedance characteristics because each of the signal traces crosses a different number of the discontinuities (104). Having different impedance characteristics for signal traces that are oriented differently increases design complexity of PCB and the electrical circuits on the PCB.

Readers of skill in the art will immediately recognize that PCBs of the prior art that include a periodically patterned reference plane have one or more shortcomings, such as for example, variations of impedance characteristics between conductive pathways, longer than necessary current return paths on the PCBs, and increased distortion of signals conducted on the PCB. What is needed, therefore, is a PCB that provides similar impedance characteristics of all conductive pathways that conduct signals on a PCB, reduces the length of current return paths on the PCB, and reduces signal distortion of signals conducted on conductive pathways of the PCB.

SUMMARY OF THE INVENTION

A printed circuit board ('PCB') with reduced signal distortion, methods for signal transmission on such a PCB, and methods of designing such a PCB, where the PCB includes one or more layers of non-conductive substrate upon which are disposed conductive pathways that conduct signals, the signals characterized by distortion at least partly caused by orientation of the conductive pathways on the layers of the printed circuit board, and a periodically patterned reference plane; each conductive pathway that conducts signals oriented orthogonally or diagonally at forty-five degrees with respect to other conductive pathways that conduct signals on the printed circuit board; the periodically patterned reference plane comprising a conductor having discontinuities arranged in a periodically recurring pattern, the pattern of the discontinuities oriented on a surface of a layer of the printed circuit board at an optimum angle, with respect to the conductive pathways that conduct signals on the printed circuit board, that reduces distortion of the signals.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 3:
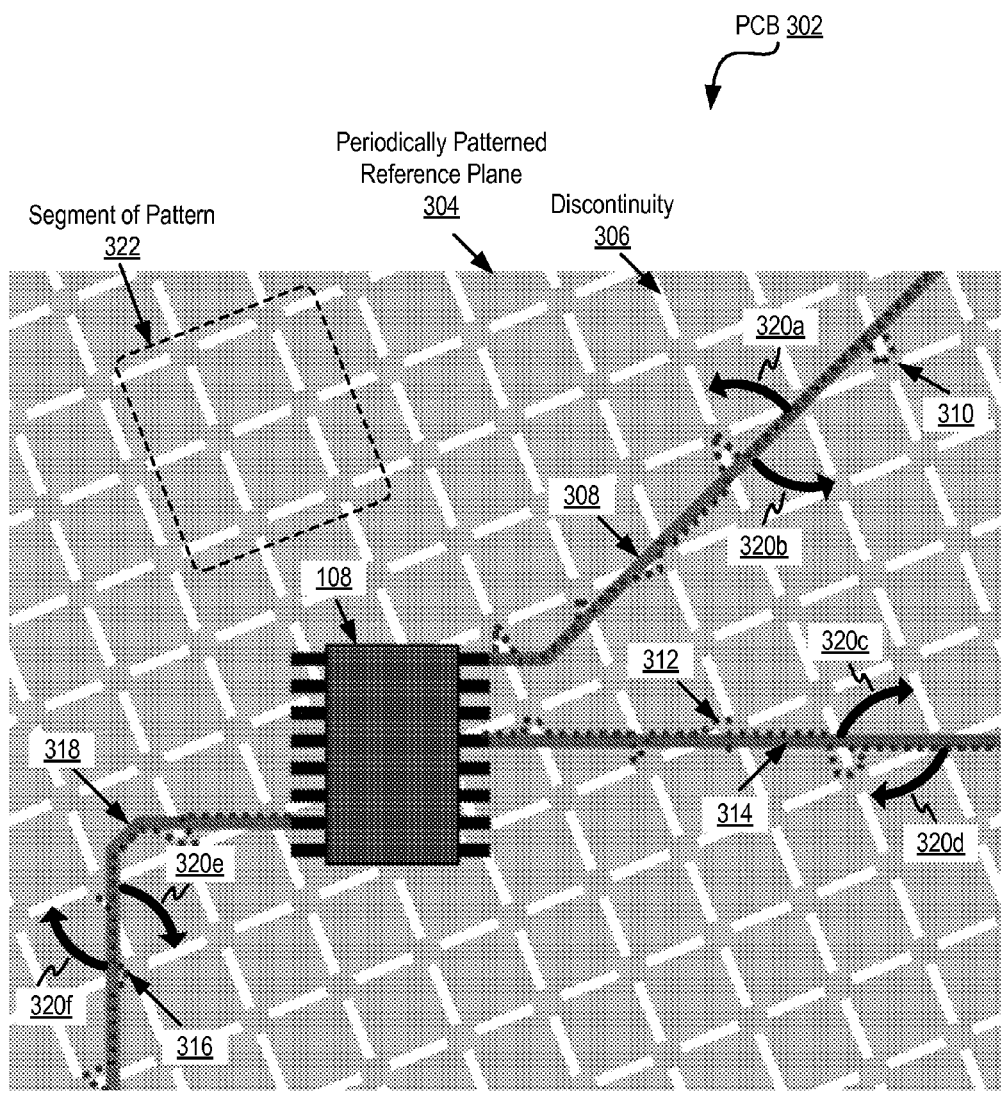
FIG. 3 sets forth a PCB with reduced signal distortion according to embodiments of the present invention.

Exemplary PCBs with reduced signal distortion, methods for signal transmission on such a PCB, and methods of designing such a PCB in accordance with embodiments of the present invention are described with reference to the accompanying drawings, beginning with FIG. 3. FIG. 3 sets forth a PCB (302) with reduced signal distortion according to embodiments of the present invention.

Figure 1:
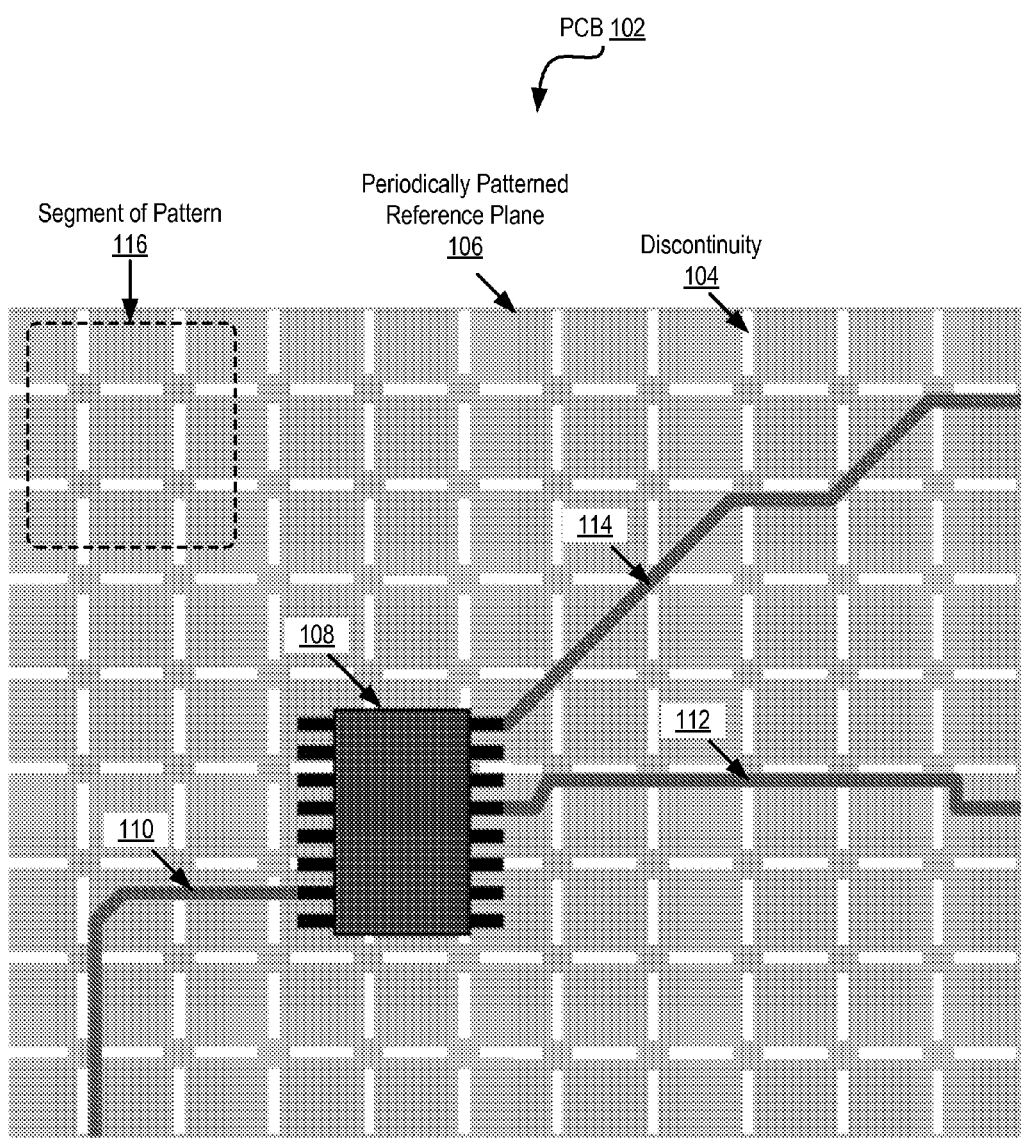
FIG. 1 illustrates a printed circuit board of the prior art having signal traces on the PCB that are routed around discontinuities of a periodically patterned reference plane.
Figure 2:
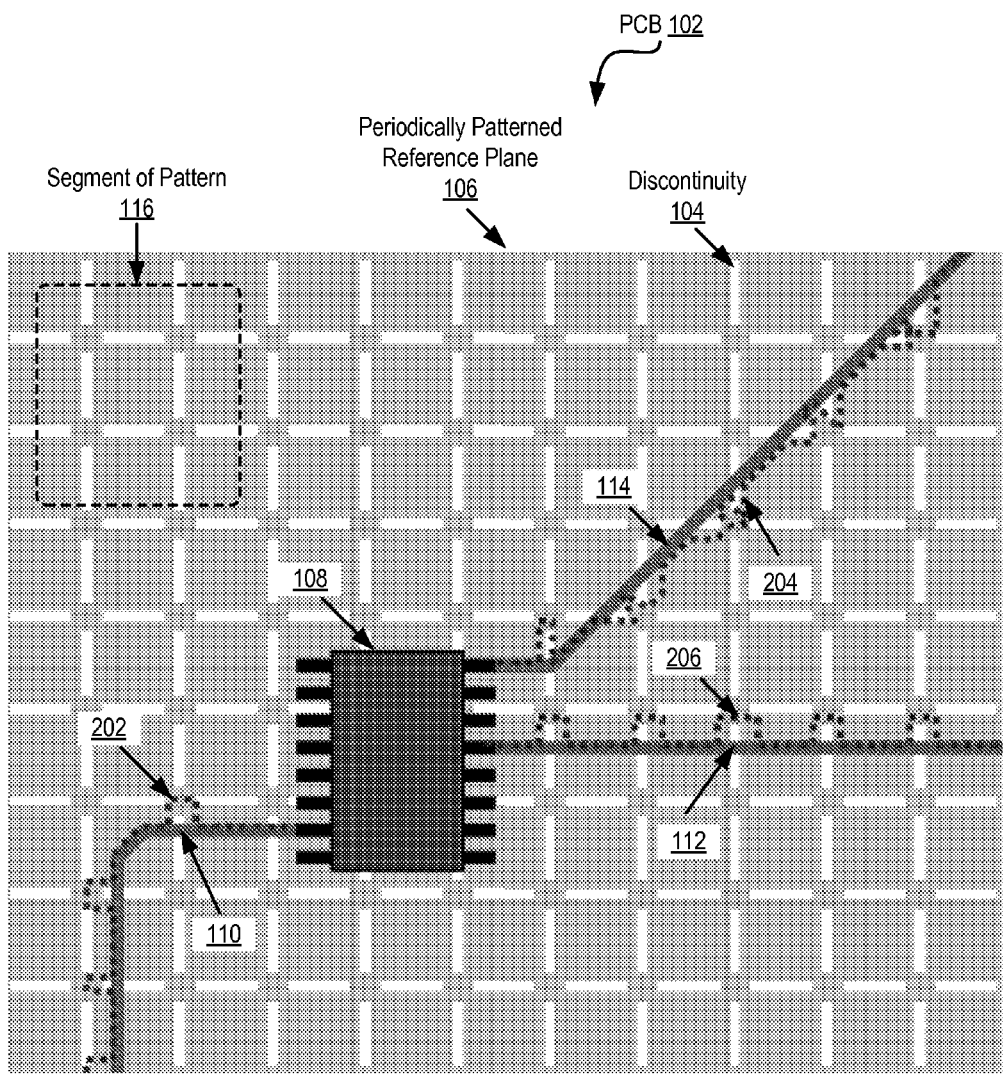
FIG. 2 illustrates a printed circuit board of the prior art in which current return paths for signals are longer than necessary.

The example printed circuit board (302) of FIG. 3 includes one or more layers of non-conductive substrate upon which are disposed conductive pathways (308, 314, 318) that conduct signals. The signals, conducted on the conductive pathways, are characterized by distortion at least partly caused by orientation of the conductive pathways (308, 314, 318) on the layers of the printed circuit board, as described above with respect to FIG. 1 and FIG. 2.

The example PCB of FIG. 3 also includes an integrated circuit (108) for clarity of explanation. The integrated circuit (108) is capable of transmitting high frequency signals along one or more of the conductive pathways (308, 314, 318) if the PCB (302). Signals transmitted along the conductive pathways may have a frequency of 1 gigahertz or higher.

In the example PCB of FIG. 3, each conductive pathway (308, 314, 318) that conducts signals is oriented orthogonally or diagonally at forty-five degrees with respect to other conductive pathways that conduct signals on the printed circuit board. With respect to FIG. 3, pathways oriented orthogonally are oriented vertically or horizontally. A conductive pathway in accordance with embodiments of the present invention may include any number of segments oriented differently. Each such segment is oriented orthogonally or diagonally with respect to other conductive pathways. Examples of conductive pathways that include segments that are oriented differently include the conductive pathway (318) and the conductive pathway (308). The conductive pathway (318) includes a horizontal segment, a diagonal segment, and a vertical segment. Conductive pathway (308) includes a horizontal segment and a diagonal segment.

The example PCB (302) of FIG. 3 also includes a periodically patterned reference plane (304). In the example PCB (302) of FIG. 3, the periodically patterned reference plane (304) is a conductor having discontinuities (306) arranged in a periodically recurring pattern. A segment (322) of the periodically recurring pattern of discontinuities is depicted in the example of FIG. 3 for clarity within dashed lines. As can be seen from the segment (322), the pattern of discontinuities in the example of FIG. 3 is a grid-like pattern.

In the example PCB of FIG. 3, the pattern of the discontinuities is oriented on a surface of a layer of the printed circuit board at an optimum angle (320a-f), with respect to the conductive pathways (308 314, 318) that conduct signals on the printed circuit board, that reduces distortion of the signals. The term 'optimum' here means that the angle of orientation of the pattern of discontinuities with respect to conductive pathways on the PCB reduces distortion of signals conducted on the conductive pathways by comparison with other angles of orientation of the pattern of discontinuities.

In the example PCB of FIG. 3, the optimum angle (320) is 22.5 degrees with respect to the conductive pathways (308, 314, 318) that conduct signals on the printed circuit board (302). Because the conductive pathways in the example of FIG. 3 are oriented at 90 degrees or 45 degrees from one another, a pattern of discontinuities oriented at an angle of 22.5 degrees from any one particular conductive pathway is also oriented at an angle of 22.5 degrees from all other conductive pathways, regardless of the other pathways' orientations. All angles (320a-320f) depicted in the PCB (302) of FIG. 3, for example, are 22.5 degrees. The pattern of discontinuities in FIG. 3, for example, is oriented at an angle (320a, 320b) of 22.5 degrees with respect to the conductive pathway (308), is oriented at an angle (320c, 320d) of 22.5 degrees with respect to the conductive pathway (314), and is also oriented at an angle (320e, 320f) with respect to the conductive pathway (318). Although the optimum angle is described here as 22.5 degrees readers of skill in the art will recognize that such an optimum angle according to embodiments of the present invention may be functionally equivalent to 22.5 degrees. That is, PCBs with reduced signal distortion in accordance with embodiments of the present may include a periodically recurring pattern of discontinuities oriented at some slight variation of 22.5 degrees. Such variations may occur in part because of engineering, design, and manufacturing tolerances which are typically imprecise.

In the example PCB of FIG. 3, the pattern of discontinuities oriented at an optimum angle (320) with respect to the conductive pathways (308, 314, 318) that conduct signals on the printed circuit board reduces distortion of the signals by minimizing the lengths of noise-inducing current return paths through the periodically patterned reference plane. Compared to the current return paths depicted in the prior art PCB of FIG. 2, readers of skill in the art will immediately recognize that the length of the current return paths (316, 312, 310) of FIG. 3 is minimized. Current return paths (316, 312, 310) in the PCB of FIG. 3, following their associated conductive pathways, are less impeded by discontinuities in the reference plane than the current return paths in the prior art PCB of FIG. 2. Because the current return paths (316, 312, 310) in the PCB of FIG. 3 are less impeded, the current return paths are routed around the discontinuities less than the current return paths of the prior art PCB of FIG. 2 and, as such, are shorter.

In the example PCB of FIG. 3, the pattern of discontinuities oriented at an optimum angle (320) with respect to the conductive pathways (308, 314, 318) that conduct signals on the printed circuit board also minimizes variations in impedance characteristics among all the conductive pathways (308, 314, 318) that conduct signals on the printed circuit board. That is, conductive pathways of the same length, regardless the pathways' orientation, will have the same or nearly the same impedance characteristics. Such similarity in impedance characteristics is caused by the orientation of the pattern of discontinuities of the reference plane (304) on the PCB (302) of FIG. 3. All conductive pathways (308, 318, 314) of equal length, regardless the orientation of the pathways, cross relatively the same number of discontinuities (306) of the periodically patterned reference plane (304). The discontinuities of the periodically patterned reference plane, then, affect the impedance characteristics of all pathways similarly. Such similarity in impedance characteristics among the conductive pathways reduces complexity of electrical circuit and PCB design. Simulation or design of an electrical circuit on a PCB according to embodiments of the present invention, for example, may be simplified by using for all traces of equal length on the PCB, the same value for transmission line impedance.

Figure 4:
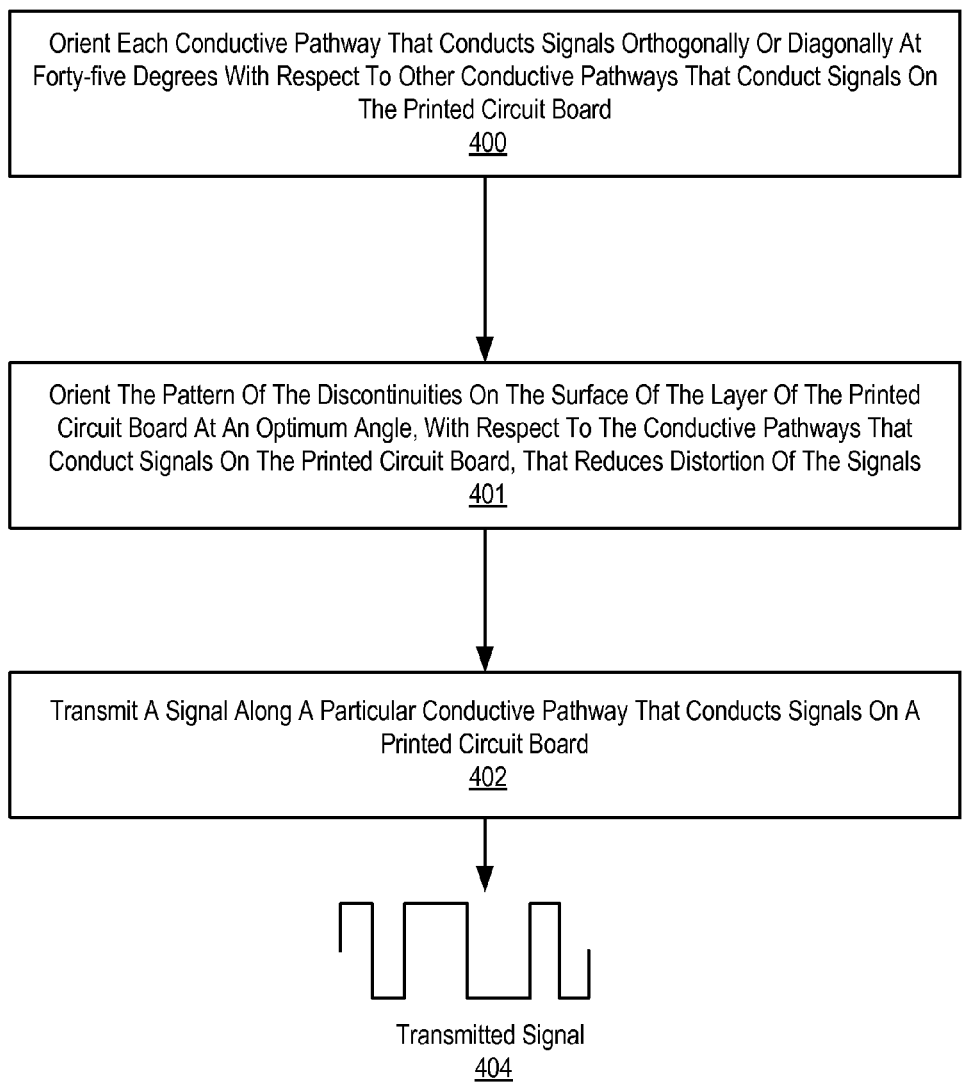
FIG. 4 sets forth a flow chart illustrating an exemplary method for signal transmission on a printed circuit board with reduced signal distortion according to embodiments of the present invention.

For further explanation, FIG. 4 sets forth a flow chart illustrating an exemplary method for signal transmission on a printed circuit board with reduced signal distortion according to embodiments of the present invention. In the method of FIG. 4, the printed circuit board (302 of FIG. 3) includes one or more layers of non-conductive substrate upon which are disposed conductive pathways (308, 314, 318 of FIG. 3) that conduct signals. Such signals are characterized by distortion at least partly caused by orientation of the conductive pathways (308, 314, 318 of FIG. 3) on the layers of the printed circuit board (302 of FIG. 3). The method of FIG. 4 includes orienting (400) each conductive pathway (308, 314, 318 of FIG. 3) that conducts signals orthogonally or diagonally at forty-five degrees with respect to other conductive pathways that conduct signals on the printed circuit board.

The PCB of FIG. 4 also includes a periodically patterned reference plane (304 of FIG. 3). The periodically patterned reference plane of FIG. 4 is a conductor having discontinuities arranged in a periodically recurring pattern on a surface of a layer of the printed circuit board (302 of FIG. 3). The method of FIG. 4 also includes orienting (401) the pattern of the discontinuities on the surface of the layer of the printed circuit board at an optimum angle, with respect to the conductive pathways that conduct signals on the printed circuit board, that reduces distortion of the signals. Orienting (401) the pattern of the discontinuities on the surface of the layer of the printed circuit board at an optimum angle, with respect to the conductive pathways that conduct signals on the printed circuit board, that reduces distortion of the signals may be carried out by orienting the pattern of discontinuities at 22.5 degrees with respect to the conductive pathways that conduct signals on the printed circuit board.

Orienting (401) the pattern of the discontinuities on the surface of the layer of the printed circuit board at an optimum angle, with respect to the conductive pathways that conduct signals on the printed circuit board, that reduces distortion of the signals may also include orienting the pattern of discontinuities at an optimum angle, with respect to the conductive pathways that conduct signals on the printed circuit board, that minimizes the lengths of noise-inducing current return paths through the periodically patterned reference plane.

Orienting (401) the pattern of the discontinuities on the surface of the layer of the printed circuit board at an optimum angle, with respect to the conductive pathways that conduct signals on the printed circuit board, that reduces distortion of the signals may also include orienting the pattern of discontinuities at an optimum angle, with respect to the conductive pathways that conduct signals on the printed circuit board, to minimize variations in impedance characteristics among all the conductive pathways that conduct signals on the printed circuit board.

The method of FIG. 4 also includes transmitting (402) a signal (404) along a conductive pathway of the printed circuit board. Transmitting (402) a signal (404) of may be carried out by a transmitter that transmits the signal to a receiver along a conductive pathway of the PCB. Examples of such transmitters, receivers, and conductive pathways include a computer processor that transmits signals to a bus adapter of a computer motherboard along a front side bus, a bus adapter that transmits signals to a video graphics processor along a high speed video bus such as an Accelerate Graphics Port ('AGP') or Peripheral Component Interconnect Extended ('PCI-X') bus, a bus adapter that transmits signals to a computer memory subsystem along a high speed memory bus, and so on as will occur to those of skill in the art. Such transmitted signals (404) in the method of FIG. 4 may have a frequency of at least one gigahertz.

Figure 5:
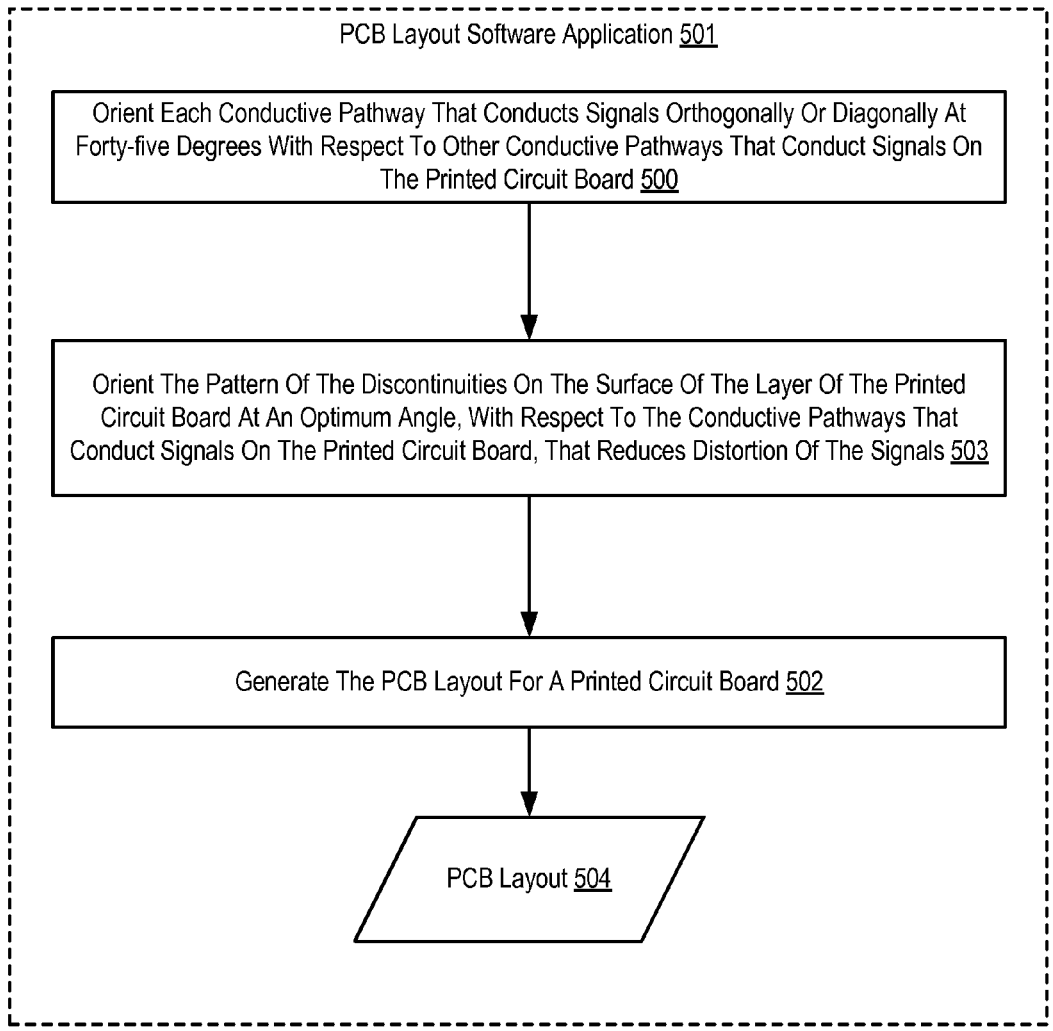
FIG. 5 sets forth a flow chart illustrating an exemplary method of designing a printed circuit board with reduced signal distortion according to embodiments of the present invention.

For further explanation, FIG. 5 sets forth a flow chart illustrating an exemplary method of designing a printed circuit board with reduced signal distortion according to embodiments of the present invention. In the method of FIG. 5, the printed circuit board (302 of FIG. 3) includes one or more layers of non-conductive substrate upon which are disposed conductive pathways (308, 314, 318 of FIG. 3) that conduct signals. Such signals are characterized by distortion at least partly caused by orientation of the conductive pathways (308, 314, 318 of FIG. 3) on the layers of the printed circuit board (302 of FIG. 3). The method of FIG. 5 includes orienting (500), by a PCB layout software application (501) for a PCB layout (504), each conductive pathway (308, 314, 318 of FIG. 3) that conducts signals orthogonally or diagonally at forty-five degrees with respect to other conductive pathways that conduct signals on the printed circuit board.

The PCB of FIG. 5 also includes a periodically patterned reference plane (304 of FIG. 3). The periodically patterned reference plane of FIG. 5 is a conductor having discontinuities arranged in a periodically recurring pattern on a surface of a layer of the printed circuit board (302 of FIG. 3). The method of FIG. 5 also includes orienting (503), by the PCB layout software application (501) for a PCB layout, the pattern of the discontinuities on the surface of the layer of the printed circuit board at an optimum angle, with respect to the conductive pathways that conduct signals on the printed circuit board, that reduces distortion of the signals. Orienting (503) the pattern of the discontinuities on the surface of the layer of the printed circuit board at an optimum angle, with respect to the conductive pathways that conduct signals on the printed circuit board, that reduces distortion of the signals may be carried out by orienting the pattern of discontinuities at 22.5 degrees with respect to the conductive pathways that conduct signals on the printed circuit board.

Orienting (503) the pattern of the discontinuities on the surface of the layer of the printed circuit board at an optimum angle, with respect to the conductive pathways that conduct signals on the printed circuit board, that reduces distortion of the signals may also include orienting the pattern of discontinuities at an optimum angle, with respect to the conductive pathways that conduct signals on the printed circuit board, that minimizes the lengths of noise-inducing current return paths through the periodically patterned reference plane.

Orienting (503) the pattern of the discontinuities on the surface of the layer of the printed circuit board at an optimum angle, with respect to the conductive pathways that conduct signals on the printed circuit board, that reduces distortion of the signals may also include orienting the pattern of discontinuities at an optimum angle, with respect to the conductive pathways that conduct signals on the printed circuit board, to minimize variations in impedance characteristics among all the conductive pathways that conduct signals on the printed circuit board.

The method of FIG. 5 also includes generating (502), by the PCB layout software application (501), the layout (504) for the printed circuit board. A layout design software application (501) is a module of computer program instructions that generates a PCB layout (504) in dependence upon user input, such as for example, specifications of physical dimensions of a PCB, a number of layers of a PCB, electrical components on the PCB, values of electrical components on the PCB, locations and orientation of electrical components on the PCB, connections of electrical components on the PCB, physical dimensions of traces on the PCB, routes of traces on the PCB, orientations of reference planes, locations of through-hole vias on the PCB, and so on as will occur to readers of skill in the art. A PCB layout (504) generated by a PCB layout software application is a definition a PCB which may be used for manufacturing the PCB, simulating operation of an electrical circuit on such a PCB, and in other ways as will occur to those of skill in the art. Examples of PCB layout software applications (501) which may be improved for designing a printed circuit board with reduced signal distortion according to embodiments of the present invention include ExpressPCB™, FreePCB™, PCB123™, Eagle Layout Editor™, DipTrace™, and so on as will occur to those of skill in the art.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A printed circuit board with reduced signal distortion, the printed circuit board comprising:

one or more layers of non-conductive substrate upon which are disposed conductive pathways that conduct signals, the signals characterized by distortion at least partly caused by orientation of the conductive pathways on the layers of the printed circuit board, and a periodically patterned reference plane;

each conductive pathway that conducts signals oriented orthogonally or diagonally at forty-five degrees with respect to other conductive pathways that conduct signals on the printed circuit board;

the periodically patterned reference plane comprising a conductor having discontinuities arranged in a periodically recurring pattern, the pattern of the discontinuities oriented on a surface of a layer of the printed circuit board at an optimum angle, with respect to the conductive pathways that conduct signals on the printed circuit board, that reduces distortion of the signals, wherein the optimum angle is 22.5 degrees with respect to the conductive pathways that conduct signals on the printed circuit board.

2. The printed circuit board of claim 1 wherein the pattern of discontinuities oriented at an optimum angle, with respect to the conductive pathways that conduct signals on the printed circuit board, that reduces distortion of the signals further comprises:

the pattern of discontinuities oriented at an optimum angle, with respect to the conductive pathways that conduct signals on the printed circuit board, that minimizes the lengths of noise-inducing current return paths through the periodically patterned reference plane.

3. The printed circuit board of claim 1 wherein the pattern of discontinuities oriented at an optimum angle, with respect to the conductive pathways that conduct signals on the printed circuit board, that reduces distortion of the signals further comprises:

the pattern of discontinuities oriented at an optimum angle, with respect to the conductive pathways that conduct signals on the printed circuit board, to minimize variations in impedance characteristics among all the conductive pathways that conduct signals on the printed circuit board.

4. The printed circuit board of claim 1 wherein the signals have a frequency of at least one gigahertz.

5. A method of signal transmission on a printed circuit board with reduced signal distortion, the printed circuit board comprising:

one or more layers of non-conductive substrate upon which are disposed conductive pathways that conduct signals, the signals characterized by distortion at least partly caused by orientation of the conductive pathways on the layers of the printed circuit board, and a periodically patterned reference plane, the periodically patterned reference plane comprising a conductor having discontinuities arranged in a periodically recurring pattern on a surface of a layer of the printed circuit board;

the method comprising:

orienting by a computer, each conductive pathway that conducts signals orthogonally or diagonally at forty-five degrees with respect to other conductive pathways that conduct signals on the printed circuit board;

orienting, by the computer, the pattern of the discontinuities on the surface of the layer of the printed circuit board at an optimum angle, with respect to the conductive pathways that conduct signals on the printed circuit board, that reduces distortion of the signals, wherein orienting the pattern of the discontinuities on the surface of the layer of the printed circuit board at an optimum angle includes orienting, by the computer, the pattern of discontinuities at 22.5 degrees with respect to the conductive pathways that conduct signals on the printed circuit board; and transmitting, by the computer, a signal along a particular one of the conductive pathways that conduct signals on the printed circuit board, the transmitted signal characterized by a reduced distortion.

6. The method of claim 5 wherein orienting the pattern of the discontinuities on the surface of the layer of the printed circuit board at an optimum angle, with respect to the conductive pathways that conduct signals on the printed circuit board, that reduces distortion of the signal further comprises:

orienting, by the computer, the pattern of discontinuities at an optimum angle, with respect to the conductive pathways that conduct signals on the printed circuit board, that minimizes the lengths of noise-inducing current return paths through the periodically patterned reference plane.

7. The method of claim 5 wherein orienting the pattern of the discontinuities on the surface of the layer of the printed circuit board at an optimum angle, with respect to the conductive pathways that conduct signals on the printed circuit board, that reduces distortion of the signal further comprises:

orienting, by the computer, the pattern of discontinuities at an optimum angle, with respect to the conductive pathways that conduct signals on the printed circuit board, to minimize variations in impedance characteristics among all the conductive pathways that conduct signals on the printed circuit board.

8. The method of claim 5 wherein the signal characterized by a reduced distortion and transmitted along the particular one of the conductive pathways has a frequency of at least one gigahertz.

9. A method of designing a printed circuit board with reduced signal distortion, the printed circuit board comprising:

one or more layers of non-conductive substrate upon which are disposed conductive pathways that conduct signals, the signals characterized by distortion at least partly caused by orientation of the conductive pathways on the layers of the printed circuit board, and a periodically patterned reference plane, the periodically patterned reference plane comprising a conductor having discontinuities arranged in a periodically recurring pattern on a surface of a layer of the printed circuit board;

the method comprising:

orienting, by using a computer to execute a PCB layout software application for a PCB layout, each conductive pathway that conducts signals orthogonally or diagonally at forty-five degrees with respect to other conductive pathways that conduct signals on the printed circuit board;

orienting, by using the computer to execute the PCB layout software application for the PCB layout, the pattern of the discontinuities on the surface of the layer of the printed circuit board at an optimum angle, with respect to the conductive pathways that conduct signals on the printed circuit board, that reduces distortion of the signals, wherein orienting the pattern of the discontinuities on the surface of the layer of the printed circuit board at an optimum angle includes orienting the pattern of discontinuities at 22.5 degrees with respect to the conductive pathways that conduct signals on the printed circuit board; and generating, by the computer to execute the PCB layout design software application, the PCB layout for the printed circuit board.

10. The method of claim 9 wherein orienting the pattern of the discontinuities on the surface of the layer of the printed circuit board at an optimum angle, with respect to the conductive pathways that conduct signals on the printed circuit board, that reduces distortion of the signal further comprises:

orienting the pattern of discontinuities at an optimum angle, with respect to the conductive pathways that conduct signals on the printed circuit board, that minimizes the lengths of noise-inducing current return paths through the periodically patterned reference plane.

11. The method of claim 9 wherein orienting the pattern of the discontinuities on the surface of the layer of the printed circuit board at an optimum angle, with respect to the conductive pathways that conduct signals on the printed circuit board, that reduces distortion of the signal further comprises:

orienting the pattern of discontinuities at an optimum angle, with respect to the conductive pathways that conduct signals on the printed circuit board, to minimize variations in impedance characteristics among all the conductive pathways that conduct signals on the printed circuit board.

12. The method of claim 9 wherein the signals have a frequency of at least one gigahertz.

* * * * *